United States Patent
Nakamura et al.

(10) Patent No.: US 12,295,182 B2
(45) Date of Patent: May 6, 2025

(54) SOLAR CELL AND METHOD FOR PRODUCING SOLAR CELL

(71) Applicant: KANEKA CORPORATION, Osaka (JP)

(72) Inventors: Junichi Nakamura, Settsu (JP); Shimpei Okamoto, Settsu (JP)

(73) Assignee: KANEKA CORPORATION, Osaka (JP)

( * ) Notice: Subject to any disclaimer, the term of this patent is extended or adjusted under 35 U.S.C. 154(b) by 178 days.

(21) Appl. No.: 18/058,686

(22) Filed: Nov. 23, 2022

(65) Prior Publication Data

US 2023/0088906 A1 Mar. 23, 2023

Related U.S. Application Data

(63) Continuation of application No. PCT/JP2021/019313, filed on May 21, 2021.

(30) Foreign Application Priority Data

May 29, 2020 (JP) .................. 2020-094583

(51) Int. Cl.
*H10F 77/20* (2025.01)
*H10F 10/166* (2025.01)
(Continued)

(52) U.S. Cl.
CPC ......... *H10F 77/219* (2025.01); *H10F 10/166* (2025.01); *H10F 71/103* (2025.01); *H10F 77/244* (2025.01); *H10F 77/935* (2025.01)

(58) Field of Classification Search
CPC ..... H01L 31/022425–022441; H01L 31/0201; H01L 31/02013; H10F 77/215; H10F 77/219; H10F 77/254; H10F 77/311
See application file for complete search history.

(56) References Cited

U.S. PATENT DOCUMENTS

2007/0295381 A1* 12/2007 Fujii ............... H01L 31/022433
    136/244
2015/0243818 A1 8/2015 Kim et al.
(Continued)

FOREIGN PATENT DOCUMENTS

JP 2011-054831 A 3/2011
JP 2015-512563 A 4/2015
(Continued)

OTHER PUBLICATIONS

Definition of "complementary" retrieved from https://www.vocabulary.com/dictionary/complementary#:~:text=If%20something%20is%20complementary%2C%20then,should%20form%20a%20family%20band! on Sep. 5, 2024.*
(Continued)

*Primary Examiner* — Christina Chern
(74) *Attorney, Agent, or Firm* — Studebaker Brackett PLLC (57) ABSTRACT

A solar cell comprising a semiconductor substrate, first semiconductor layers, second semiconductor layers, a band-like first base electrode stacked on the first semiconductor layer, a band-like second base electrode stacked on the second semiconductor layer, a first electrode insulation stacked on the first base electrodes, a second electrode insulation stacked on the second base electrodes, an intermediate insulation stacked on a region of the first semiconductor layer in which the first base electrode is not stacked, and a region of the second semiconductor layer in which the second base electrode is not stacked, a first current collector stacked to span the second electrode insulation and the intermediate insulation, and a second current collector stacked to span the first electrode insulation and the intermediate insulation.

16 Claims, 6 Drawing Sheets

(51) Int. Cl.
    *H10F 71/10*         (2025.01)
    *H10F 77/00*         (2025.01)

(56) References Cited

U.S. PATENT DOCUMENTS

| | | |
|---|---|---|
| 2015/0380571 A1 | 12/2015 | Shin et al. |
| 2016/0020342 A1* | 1/2016 | Heng .............. H01L 31/022466 |
| | | 136/256 |
| 2017/0012156 A1* | 1/2017 | Lim ..................... H01L 31/049 |
| 2018/0062012 A1 | 3/2018 | Yoshikawa et al. |
| 2019/0189812 A1 | 6/2019 | Yoshikawa et al. |

FOREIGN PATENT DOCUMENTS

| | | |
|---|---|---|
| JP | 2015-159286 A | 9/2015 |
| WO | 2013/140325 A1 | 9/2013 |
| WO | 2016/158977 A1 | 10/2016 |
| WO | 2018/037672 A1 | 3/2018 |

OTHER PUBLICATIONS

International Search Report issued in PCT/JP2021/019313; mailed Aug. 10, 2021.

* cited by examiner

SOLAR CELL AND METHOD FOR PRODUCING SOLAR CELL

CROSS-REFERENCE TO RELATED APPLICATIONS

This application claims benefit of priority to International Patent Application No. PCT/JP2021/019313, filed May 21, 2021, and to Japanese Patent Application No. 2020-094583, filed May 29, 2020, the entire contents of each are incorporated herein by reference.

BACKGROUND

Technical Field

The present disclosure relates to a solar cell and a solar cell production method.

Background Art

A back contact-type solar cell has been known which includes a plurality of band-like first semiconductor layers and second semiconductor layers formed alternately on the back surface of a semiconductor substrate; a plurality of band-like first base electrodes and second base electrodes stacked on the first semiconductor layer and second semiconductor layer respectively; a plurality of first connection electrodes and second connection electrodes stacked alternately on the first base electrode and second base electrode; a first current collector arranged so as to bridge between a plurality of the first connection electrodes; and a second current collector arranged so as to bridge between a plurality of the second connection electrodes.

In such a solar cell, in order to prevent short circuit between the first base electrode and second current collector and short circuit between the second base electrode and first current collector, a configuration has also been known which stacks an insulating material on a region intersecting the second current collector of the first base electrode and a region intersecting the first current collector of the second base electrode, as described, for example, in Japanese Unexamined Patent Application, Publication No. 2015-159286.

SUMMARY

In the case of producing the aforementioned such a back contact-type solar cell, it is necessary to position the first current collector and second current collector consisting of metallic wire or the like and join with solder or the like to the first connection electrode and the second electrode. If decreasing the arrangement pitch of the first semiconductor layer and second semiconductor layer for improving the current collection efficiency, since the first connection electrode and second connection electrode are made smaller scale and narrower pitch, positioning of the first current collector and the second current collector becomes difficult, and there is concern over connection of the first current collector and the second current collector to the first connection electrode and second connection electrode becoming unreliable.

Accordingly, the present disclosure provides a solar cell and solar cell production method for which connection of current collectors to connection electrodes is reliable.

A solar cell according to a first aspect of the present disclosure includes: a semiconductor substrate; a plurality of first semiconductor layers and a plurality of second semiconductor layers each formed in a band shape extending in a first direction, and alternately provided in a second direction intersecting the first direction; a band-like first base electrode stacked on a back surface side of a central part in the second direction of the first semiconductor layer, and a band-like second base electrode stacked on a back surface side of a central part in the second direction of the second semiconductor layer; a first electrode insulation stacked on a back surface side of a first insulating area of each of the first base electrodes, the first insulating area being complementary to a first connection region established in each of the first base electrodes so as to align in the second direction, and a second electrode insulation stacked on a back surface side of a second insulating area of each of the second base electrodes, the second insulating area being complementary to a second connection region established in each of the second base electrodes so as to align in the second direction at a position shifted in the first direction from the first connection region; an intermediate insulation stacked on a back surface side of a region of the first semiconductor layer in which the first base electrode is not stacked, and on a back surface side of a region of the second semiconductor layer in which the second base electrode is not stacked; and a first current collector stacked to span the second electrode insulation and the intermediate insulation so as to connect between a plurality of the first connection regions, and a second current collector stacked to span the first electrode insulation and the intermediate insulation so as to connect between a plurality of the second connection regions.

In the solar cell as described in the aspect of the present disclosure, a material of the first current collector and the second current collector may be solder or an electrically-conductive adhesive.

The solar cell as described in the aspect of the present disclosure may further include: a first connection electrode stacked on a back side surface of the first connection region of the first base electrode, and a second connection electrode stacked on a back surface side of the second connection region of the second base electrode.

The solar cell as described in the aspect of the present disclosure may further include: a first transparent electrode interposed between the first semiconductor layer and the first base electrode; and a second transparent electrode interposed between the second semiconductor layer and the second base electrode.

In the solar cell as described in the aspect of the present disclosure, the intermediate insulation may be white in color.

The solar cell production method according to another aspect of the present disclosure includes the steps of: providing, on a back surface side of a semiconductor substrate, a plurality of band-like first semiconductor layers and a plurality of band-like second semiconductor layers respectively extending in a first direction, alternately in a second direction intersecting the first direction; stacking a metallic layer so as to cover a back surface side of the first semiconductor layer and the second semiconductor layer; stacking a first electrically-conductive paste on first connection regions aligning in the second direction, which are parts of a plurality of first band-like regions overlapping a central part in the second direction of each of the first semiconductor layers on a back surface side of the metallic layer, and a plurality of second connection regions aligned in the second direction at shifted positions from the first connection region, which are parts of a plurality of second band-like regions overlapping a central part in the second direction of each of the second semiconductor layers, on a back surface side of the metallic layer; stacking a first insulating material on a first insulating area complementary to the first connection region of the first band-like region, and on a second insulating area complementary to the second connection region of the second band-like region, on a back surface side of the metallic layer; removing portions other than the first band-like region and the second band-like region of the metallic layer, by etching with the first electrically-conductive paste and the first insulating material as a mask; stacking a second insulating material on a back surface side of the first semiconductor layer and the second semiconductor layer exposed by the etching; and stacking the second electrically-conductive paste in a band shape extending in the second direction on each of the first insulating material, and a region spanning a plurality of the first connection regions and a region spanning a plurality of the second connection regions on a back surface side of the first insulating material.

According to the present disclosure, it is possible to provide a solar cell for which connection of current collectors to connection electrodes is reliable.

DETAILED DESCRIPTION

Hereinafter, embodiments of the present disclosure will be explained while referencing the drawings. It should be noted that, although hatching, member reference numbers, etc. may be omitted for convenience, in such a case, other drawings shall be referenced. In addition, the dimensions of various members in the drawings are adjusted to facilitate understanding for convenience.

Figure 1:
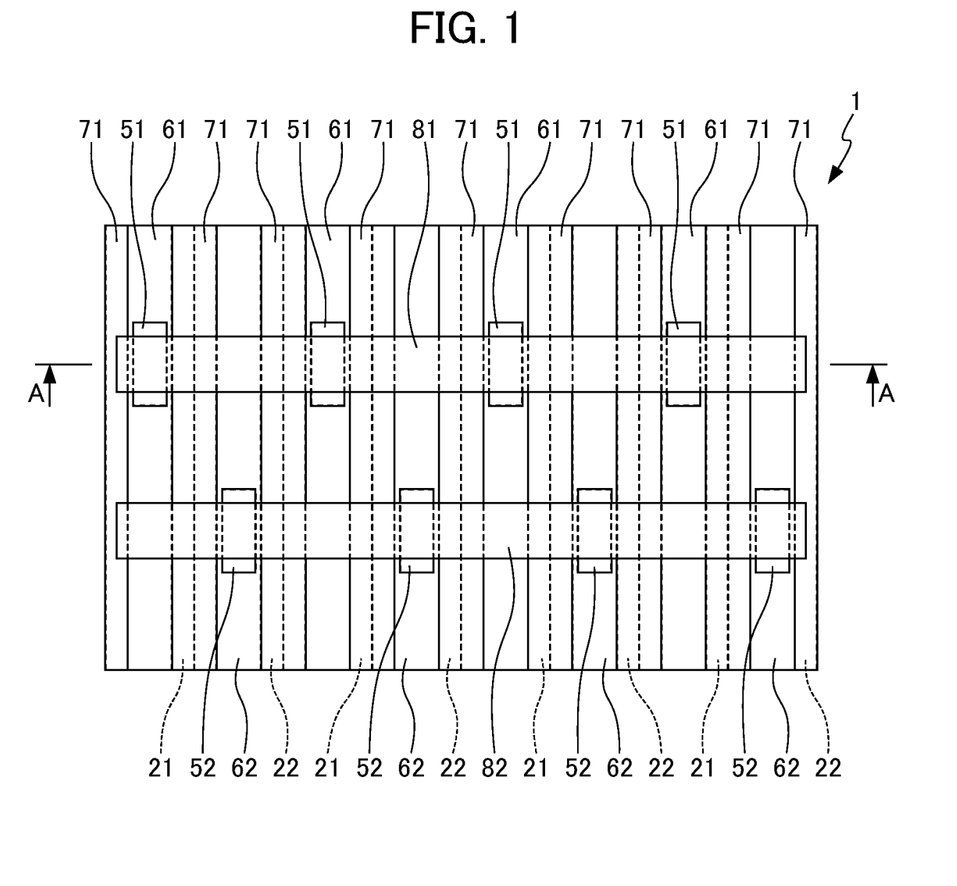
FIG. 1 is a back surface view of a solar cell according to an embodiment of the present disclosure.
Figure 2:
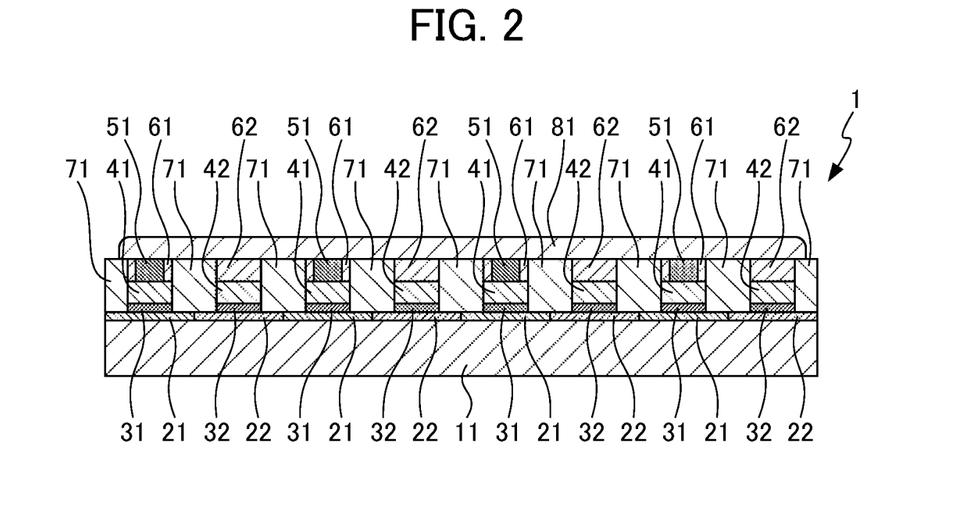
FIG. 2 is a cross-sectional view along the line A-A of the solar cell in FIG. 1.

FIG. 1 is a back surface view of a solar cell 1 according to an embodiment of the present disclosure. FIG. 2 is a cross-sectional view along the line A-A of the solar cell 1.

The solar cell 1 is a solar battery cell of so-called heterojunction back contact type. The solar cell 1 includes: a semiconductor substrate 11; a plurality of first semiconductor layers 21 and a plurality of second semiconductor layers 22 formed in a band shape respectively extending in a first direction on the back surface side (opposite side to light incident surface) of the semiconductor substrate 11, and provided alternately in a second direction intersecting the first direction; a plurality of first transparent electrodes 31 and a plurality of second transparent electrodes 32 respectively stacked in a band shape extending in a first direction at a second direction central part on a back surface side of the first semiconductor layer 21 and second semiconductor layer 22; a plurality of first base electrodes 41 and a plurality of second base electrodes 42 respectively stacked on substantially the entire surface on the back surface side of the first transparent electrode 31 and second transparent electrode 32; a plurality of first connection electrodes 51 partially stacked on the back surface side of each of the first base electrodes 41 and provided to be aligned in the second direction, and a plurality of second connection electrodes 52 partially stacked on the back surface side of each of the second base electrodes 42, and provided to be aligned in the second direction to be staggered from the first connection electrode 51; a first electrode insulation 61 stacked in a region of the first base electrode 41 without the first connection electrode 51, and a second electrode insulation 62 stacked in a region of the second base electrode 42 without the second connection electrode 52; an intermediate insulation 71 stacked on the back surface side of a region of the first semiconductor layer 21 in which the first transparent electrode 31 and first base electrode 41 are not stacked, and on the back surface side of a region of the second semiconductor layer 22 in which the second transparent electrode 32 and second base electrode 42 are not stacked; a first current collector 81 stacked to span the second electrode insulation 62 and intermediate insulation 71 so as to connect the plurality of first connection electrodes 51; and a second current collector 82 stacked to span the first electrode insulation 61 and intermediate insulation 71 so as to connect between the plurality of second connection electrodes 52.

The semiconductor substrate 11 is formed from a crystalline silicon material such as a single crystal silicon or polycrystal silicon. The semiconductor substrate 11 is an n-type semiconductor substrate in which n-type dopant is doped to the crystalline silicon material, for example. As the n-type dopant, for example, phosphorus (P) can be exemplified. The semiconductor substrate 11 functions as the photoelectric conversion substrate which generates optical carriers (electrons and electron holes) by absorbing incident light from a light receiving surface side. By the crystalline silicon being used as the material of the semiconductor substrate 11, even in a case of the dark current being relatively small, and the intensity of incident light being low, a relatively high output (stable output irrespective of illuminance) is thereby obtained.

The first semiconductor layer 21 and second semiconductor layer 22 have different conductivity types from each other. As an example, the first semiconductor layer 21 is formed from p-type semiconductor, and the second semiconductor layer 22 is formed from n-type semiconductor. The first semiconductor layer 21 and second semiconductor layer 22, for example, can be formed by an amorphous silicon material containing dopant imparting the desired conductivity type, for example. As the p-type dopant, for example, boron (B) can be exemplified, and as the n-type dopant, for example, the aforementioned phosphorus (P) can be exemplified.

The first semiconductor layer 21 and second semiconductor layer 22 are each formed in a band shape extending in a first direction. In the solar cell 1, the plurality of first semiconductor layers 21 and plurality of second semiconductor layers 22 are alternately provided in a second direction intersecting the first direction. The first semiconductor layer 21 and second semiconductor layer 22 are preferably arranged so as to cover substantially the entire surface of the semiconductor substrate 11. The first semiconductor layer 21 and second semiconductor layer 22 collect charge by attracting carriers generated within the semiconductor substrate 11.

The first transparent electrode 31 and second transparent electrode 32 are thin layers collecting current from the first semiconductor layer 21 and second semiconductor layer 22, and supplying electric charge to the first base electrode 41 and second base electrode 42. In addition, the first transparent electrode 31 and second transparent electrode 32 function as intermediate layers which prevent a decline in adhesion and an increase in electrical resistance at the boundary produced by differences, etc. in material property between the first semiconductor layer 21 and second semiconductor layer 22, along with the first base electrode 41 and second base electrode 42.

The first transparent electrode 31 and second transparent electrode 32 are stacked over substantially the entire length of the first semiconductor layer 21 and second semiconductor layer 22 in the first direction, with a width smaller than the first semiconductor layer 21 and second semiconductor layer 22 in the second direction, so as not to contact each other.

The first transparent electrode 31 and second transparent electrode 32 can be formed from the same material. As the material forming the first transparent electrode 31 and second transparent electrode 32, for example, it is possible to exemplify ITO (Indium Tin Oxide), zinc oxide (ZnO), etc.

The first base electrode 41 is stacked so as to extend in the first direction on each of the first transparent electrodes 31, and the second base electrode 42 is stacked so as to extend in the first direction on each of the second transparent electrode 32. The first base electrode 41 and second base electrode 42 extract electrical charge from the first semiconductor layer 21 and second semiconductor layer 22 via the first transparent electrode 31 and second transparent electrode 32. The first base electrode 41 and second base electrode 42 are formed from a metal such as copper, for example.

The first connection electrode 51 is stacked on the back surface side of each of the first connection electrodes established in each of the first base electrodes 41 so as to align in the second direction. The second connection electrode 52 is stacked on the back surface side of each of the second connection regions established on each of the second base electrodes 42 so as to align in the second direction at shifted positions in the first direction from the first connection electrode. Conversely, the region in which the first connection electrode 51 is stacked is the first connection region, and the region in which the second connection electrode 52 is stacked is the second connection region. So long as the size and shape of the first connection region and second connection region can enable electrical connection, they are not particularly limited; however, in the present embodiment, the first connection region is established as a square region of a second direction central part of each first base electrode 41, and the second connection region is established as a square region of a second direction central part of each second base electrode 42.

The first connection electrode 51 electrically connects the first base electrode 41 and first current collector 81 by interposing between the first base electrode 41 and first current collector 81. The second connection electrode 52 electrically connects the second base electrode 42 and second current collector 82, by interposing between the second base electrode 42 and second current collector 82. The first connection electrode 51 and second connection electrode 52 make electrical connection of the first current collector 81 and second current collector 82 to the first connection electrode 51 and second connection electrode 52 reliable, by raising the height position of the connection surface of the first base electrode 41 and second base electrode 42 to the first current collector 81 and second current collector 82 so as to substantially match the back surface of the first electrode insulation 61 and second electrode insulation 62.

The first connection electrode 51 and second connection electrode 52 are arranged staggered in the first direction so as to be able to prevent short circuit between the first current collector 81 and second current collector 82. In addition, the first connection electrode 51 and second connection electrode 52 are preferably arranged at a first direction central part of the first base electrode 41 and second base electrode 42 so that the electrical resistance from both ends of the first base electrode 41 and second base electrode 42 decreases.

The first connection electrode 51 and second connection electrode 52 can be formed from electrically-conductive paste such as silver paste, for example. The first connection electrode 51 and second connection electrode 52 are preferably formed from the same type of material as the first base electrode 41 and second base electrode 42 in order to improve the adhesion between the first base electrode 41 and second base electrode 42.

The first electrode insulation 61 covers a portion of the first base electrode 41 exposed from the first connection electrode 51, by being stacked to the back surface side of the first insulating area, which is a region complementary to the first connection region of the first base electrode 41 (region excluding the first connection region from the entire region of the first base electrode 41 in a plan view). The second electrode insulation 62 covers a portion of the second base electrode 42 exposed from the second connection electrode 52, by being stacked on the back surface side of the second insulating area, which is a region complementary to the second connection region of the second base electrode 42 (region excluding the second connection region from the entire region of the second base electrode 42 in a plan view). The first electrode insulation 61 and second electrode insulation 62 are formed from a material having an insulation property with epoxy resin or the like as the main component, for example.

The first electrode insulation 61 may be stacked to partially overlap with the first connection electrode 51 so as not to form a gap with the first connection electrode 51, even if there is error in the lamination position. Similarly, the second electrode insulation 62 may be stacked to partially overlap with the second connection electrode 52. Furthermore, the first electrode insulation 61 and second electrode insulation 62 may respectively surround the first connection electrode 51 and second connection electrode 52 so that side edges can form a linear band-like region together with the first connection electrode 51 and second connection electrode 52. In other words, the first electrode insulation 61 and second electrode insulation 62 may have an opening exposing the first connection electrode 51 or second connection electrode 52.

The intermediate insulation 71 is arranged so as to bury a region, on the back surface side of the semiconductor substrate 11 in which the first semiconductor layer 21 and second semiconductor layer 22 are arranged, in which the first connection electrode 51, second connection electrode 52, first electrode insulation 61 and second electrode insulation 62 are not stacked. In other words, the intermediate insulation 71 continuously covers the back surface side of the semiconductor substrate 11 together with the first connection electrode 51, second connection electrode 52, first electrode insulation 61 and second electrode insulation 62. The intermediate insulation 71 is formed from a material having an insulation property with an epoxy resin or the like as the main component, for example.

The intermediate insulation 71 is preferably white color. In other words, the intermediate insulation 71 preferably contains a light diffusing material. It is thereby possible to increase the carrier generation amount by reflecting light having penetrated the semiconductor substrate 11, first semiconductor layer 21 and second semiconductor layer 22 and returning to the semiconductor substrate 11.

The first current collector 81 and second current collector 82 respectively connect the first connection electrode 51 and second connection electrode 52, and are used also as terminals for extracting electric power from the solar cell 1. The first current collector 81 and second current collector 82 can be formed from solder or an electrically-conductive adhesive.

Figure 3:
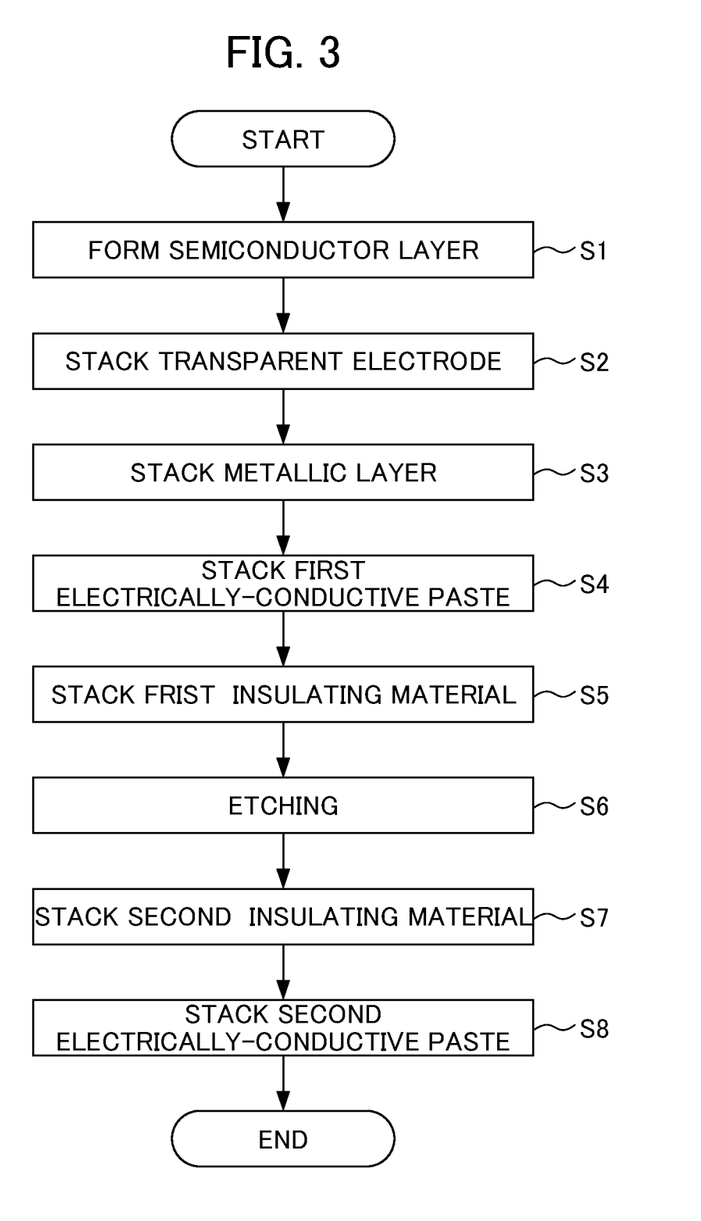
FIG. 3 is a flowchart showing a sequence of a production method of the solar cell in FIG. 1.

FIG. 3 shows a sequence of a production method of the solar cell 1. The solar cell production method of FIG. 3 is an embodiment of a solar cell production method according to the present disclosure.

The solar cell production method of the present embodiment includes: a semiconductor layer stacking step (Step S1); transparent electrode stacking step (Step S2); a metallic layer stacking step (Step S3); a first electrically-conductive paste stacking step (Step S4); a first insulating material stacking step (Step S5); an etching step (Step S6); a second insulating material stacking step (Step S7); and a second electrically-conductive paste stacking step (Step S8).

In the semiconductor layer stacking step of Step S1, a plurality of band-shaped first semiconductor layers 21 and a plurality of band-shaped second semiconductor layer 22, each extending in a first direction, are formed alternately in a second direction, by stacking the semiconductor material on the back surface side of the semiconductor substrate 11, as shown in FIG. 4. More specifically, the first semiconductor layer 21 and second semiconductor layer 22 can be formed in order by forming a mask on the back surface of the semiconductor substrate 11, and stacking the semiconductor material according to a film deposition technique such as CVD, for example.

Figure 4A:
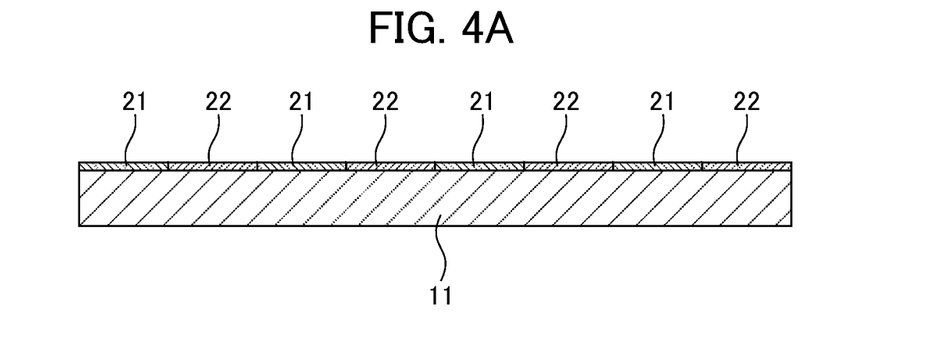
FIG. 4A is a cross-sectional view showing a process of the production method of the solar cell in FIG. 1.
Figure 4B:
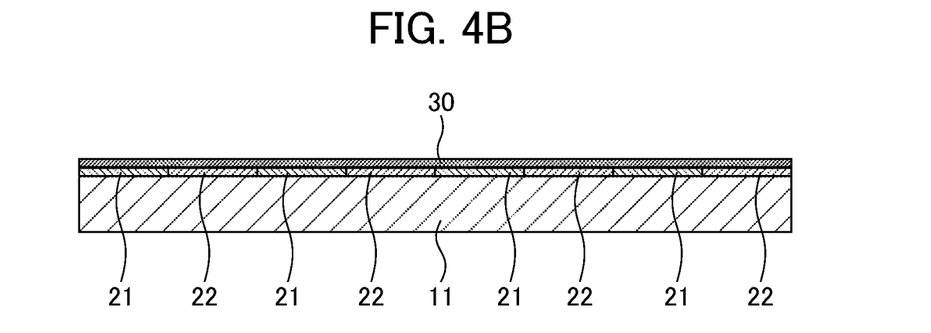
FIG. 4B is a cross-sectional view showing the process following FIG. 4A in the production method of the solar cell in FIG. 1.

In the transparent electrode stacking step of Step S2 the transparent electrode layer 30 consisting of the material forming the first transparent electrode 31 and second transparent electrode 32 is stacked on the overall surface on the back surface side of the semiconductor substrate 11, so as to cover the first semiconductor layer 21 and second semiconductor layer 22, as shown in FIG. 4B. The transparent electrode layer 30 can be stacked by a film deposition technique such as sputtering, for example.

Figure 4C:
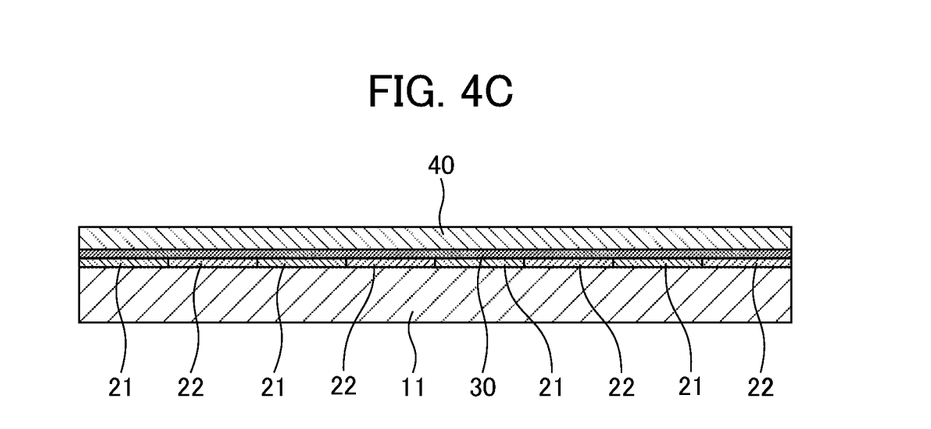
FIG. 4C is a cross-sectional view showing the process following FIG. 4B in the production method of the solar cell in FIG. 1.

In the metallic layer stacking step of Step S3, a metallic layer 40 consisting of the metal forming the first base electrode 41 and second base electrode 42 is stacked, so as to cover the back surface sides of the first semiconductor layer 21 and second semiconductor layer 22 via the transparent electrode layer 30, as shown in FIG. 4C. For example, this metallic layer 40 can be stacked by sputtering, plating, etc.

Figure 4D:
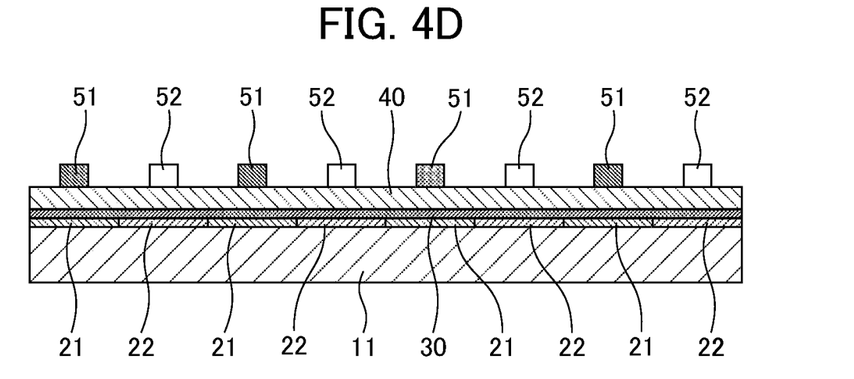
FIG. 4D is a cross-sectional view showing the process following FIG. 4C in the production method of the solar cell in FIG. 1.

In the first electrically-conductive paste stacking step of Step S4, as shown in FIG. 4D, the first connection electrode 51 and second connection electrode 52 are formed, by stacking the first electrically conductive paste in a plurality of first connection regions aligned in the second direction, which are parts of the plurality of first band-like regions overlapping a central part in the second direction of each of the first semiconductor layers 21 on the back surface side of the metallic layer 40, and on the plurality of second connection regions aligned in the second direction at positions shifted from the first connection region, which are parts of the plurality of second band-like regions overlapping the central part in the second direction of each of the second semiconductor layers 22 on the back surface side of the metallic layer 4. It should be noted that the first band-shaped region is a region forming the first base electrode 41, and the second band-shaped region is a region forming the second base electrode 42.

The first electrically-conductive paste can be established as a paste containing metallic particles such as silver paste, binder such as a resin adhering the metallic particles or glass, and a solvent for adjusting the viscosity during printing. Such a first electrically-conductive paste can be selectively stacked using printing technology such as screen printing, for example.

For this reason, the first electrically-conductive paste stacking step includes a step of printing the first electrically-conductive paste, and a step of firing the printed first electrically-conductive paste. In the case of the processes described later including a firing step, the firing step may be performed simultaneously with these firing steps. In this case, in order to configure so that the first electrically-conductive paste does not deform during other processes after printing, the first electrically-conductive paste stacking step preferably has a step of drying by evaporating the solvent from the first electrically-conductive paste.

Figure 4E:
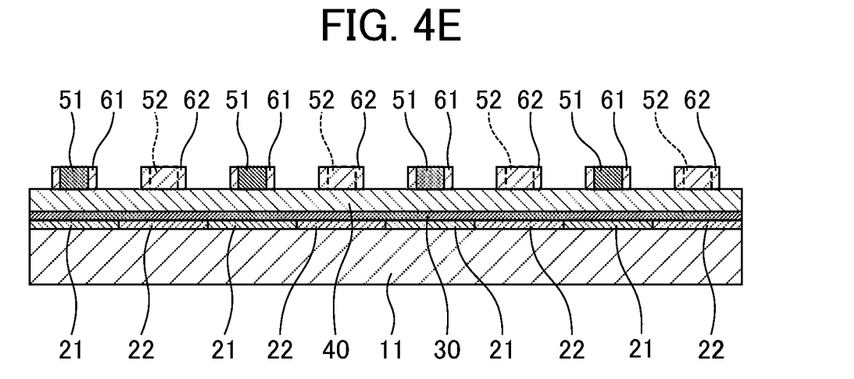
FIG. 4E is a cross-sectional view showing the process following FIG. 4D in the production method of the solar cell in FIG. 1.

In the first insulating material stacking step of Step S5, the first insulating material is stacked in a first insulating area complementary to the first connection region of the first band-shaped region, and a second insulating area complementary to the second connection region of the second band-shaped region, on the back surface side of the metallic layer 40, as shown in FIG. 4E. The first insulating material stacked in the first insulating area forms a first electrode insulation 61, and the first insulating material stacked in the second insulating area forms a second electrode insulation 62.

As the first insulating material, it is possible to use a paste-like resin composition with a thermosetting resin as the main component, for example. Such a first insulating material can be selectively stacked using a printing technology such as screen printing, for example.

For this reason, the first insulating material stacking step includes a step of printing the first insulating material, and a step of firing (thermosetting) the printed first electrically-conductive paste. In the case of performing other processes after printing and before firing, in order to configure so that the first insulating material printed until firing does not deform, the first insulating material stacking step may have a step of drying the solvent for viscosity adjustment contained in the resin composition after printing.

The first insulating material stacking step may be performed before the first electrically-conductive paste stacking step. In the case of performing the first insulating material stacking step after the first electrically-conductive paste stacking step, it is possible to increase the contact area of the first connection electrode 51 and second connection electrode 52 to the first base electrode 41 and second base electrode 42. In the case of performing the first insulating material stacking step before the first electrically-conductive paste stacking step, it is possible to increase the contact area of the first connection electrode 51 and second connection electrode 52 to a first current collector 81 and second current collector 82. Although there is concern over bleed occurring in printing, the first electrically-conductive paste and first insulating material can differ in the blending tendency due to the materials thereof and printing conditions. For this reason, considering the size of each constituent element and bleeding of the first electrically-conductive paste and first insulating material, it is possible to make the connection between each constituent element more reliable, by selecting the order of the first insulating material stacking step and the first electrically-conductive paste stacking step.

Figure 4F:
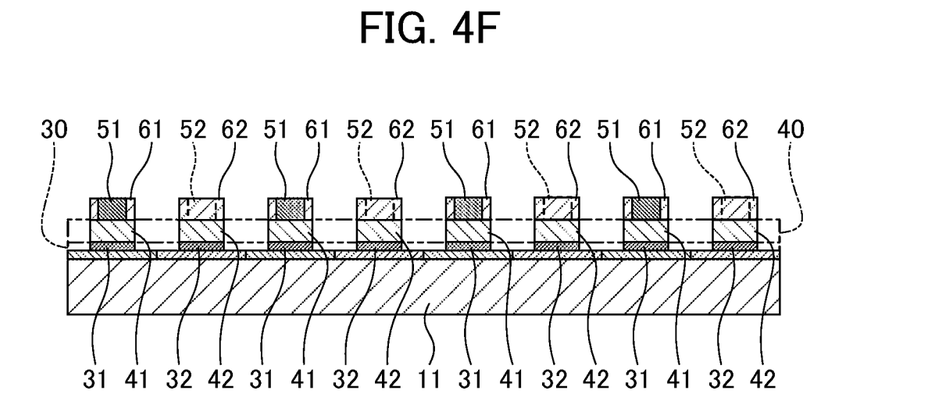
FIG. 4F is a cross-sectional view showing the process following FIG. 4E in the production method of the solar cell in FIG. 1.

In the etching step of Step S6, a portion other than the first band-shaped region and second band-shaped region of the transparent electrode layer 30 and metallic layer 40 is removed, by etching with the first electrically-conductive paste and first insulating material as the mask, as shown in FIG. 4F. The remaining transparent electrode layer 30 thereby forms the first transparent electrode 31 and second transparent electrode 32, and the remaining metallic layer 40 thereby forms the first base electrode 41 and second base electrode 42.

In this way, by using the first connection electrode 51, second connection electrode 52, first electrode insulation 61 and second electrode insulation 62, which are constituent elements of the solar cell 1, as the etching mask of the transparent electrode layer 30 and metallic layer 40, it is possible to reduce the production cost of the solar cell 1 due to a dedicated etching mask forming step and peeling step not being necessary.

Figure 4G:
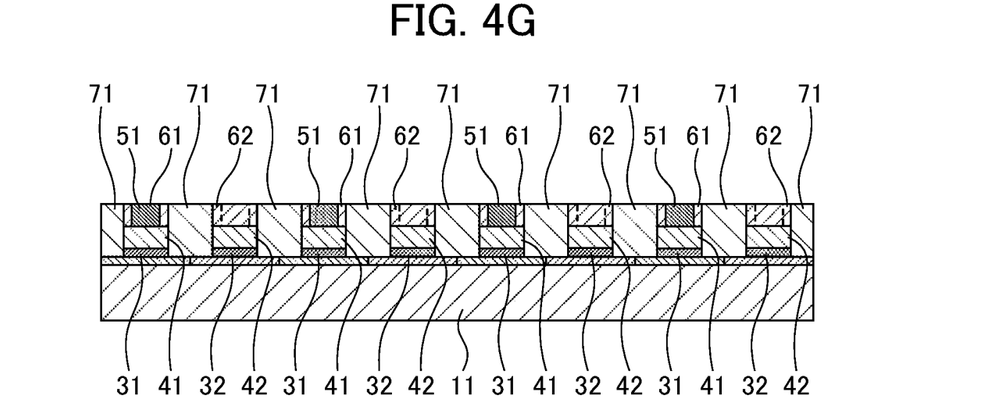
FIG. 4G is a cross-sectional view showing the process following FIG. 4F in the production method of the solar cell in FIG. 1.

In the second insulating layer stacking step of Step S7, an intermediate insulation 71 is formed, by stacking the second insulating material on the back surface side of the first semiconductor layer 21 and second semiconductor layer 22 exposed by etching, as shown in FIG. 4G.

Figure 4H:
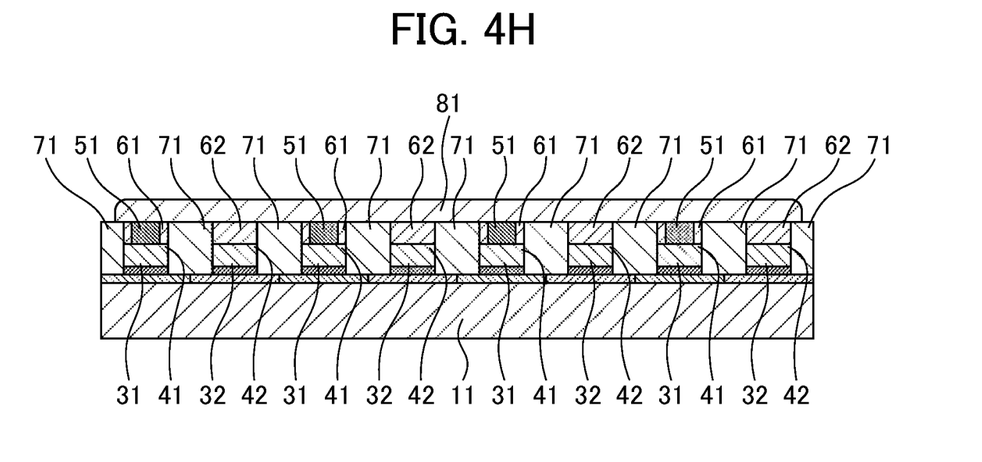
FIG. 4H is a cross-sectional view showing the process following FIG. 4G in the production method of the solar cell in FIG. 1.

In the second electrically-conductive paste stacking step of Step S8, the second electrically-conductive paste is stacked into a band shape extending in the second direction on each of the first electrically-conductive paste, the first insulating material, and a region spanning a plurality of the first connection regions and a region spanning a plurality of the second connection region on the back surface side of the first insulating material, as shown in FIG. 4H. The first current collector 81 and second current collector 82 are thereby formed from the second insulating material.

Since it is possible to form the first current collector 81 and second current collector 82 having low electrical resistance, a solder paste containing solder particles and flux can be particularly favorably used as the second electrically-conductive paste. By using solder paste as the second electrically-conductive paste, after forming the first current collector 81 and second current collector 82 which do not easily deform by drying or reflowing the solder paste in the second insulating layer stacking step, upon connecting the solar cell 1 to another solar cell 1 or an external circuit, it is possible to use a part of the solder forming the first current collector 81 and second current collector 82 for the connection with other conductors.

The second electrically-conductive paste can be selectively stacked using printing technology such as screen printing, for example. For this reason, compared to a case of connect members such as metal wires while positioning to the first connection electrode 51 and second connection electrode 52, it is possible to accurately and reliably connect the first current collector 81 and second current collector 82 to the first connection electrode 51 and second current electrode 52. At this time, by the intermediate insulation 71 being formed, it is possible to prevent short circuit occurring from the first current collector 81 and second current collector 82 contacting with the first base electrode 41, second base electrode 42, first transparent electrode 31, second transparent electrode 32, first semiconductor layer 21, second semiconductor layer 22 and semiconductor substrate 11.

In the above way, the solar cell 1 has high reliability of connection of the first current collector 81 and second current collector 82 to the first connection electrode 51 and second connection electrode 52, while being able to produce relatively cheaply.

Figure 5:
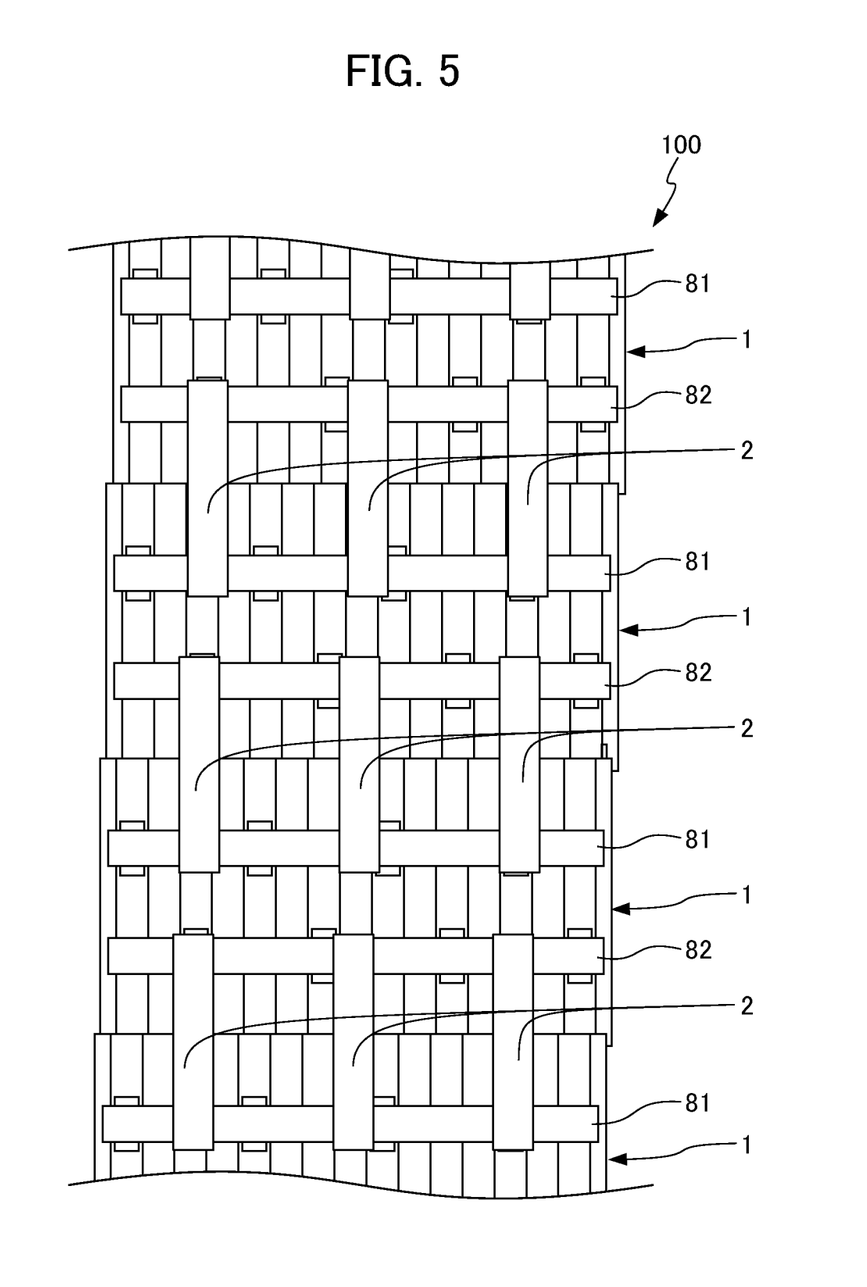
FIG. 5 is a back surface view of a solar cell string made using the solar cell of FIG. 1.

FIG. 5 illustrates a solar cell string 100 having a plurality of the solar cells 1. The solar cell string 100 includes: a plurality of the solar cells 1 arranged inline in the first direction; and wiring material 2 connecting a first current collector 81 of the solar cell 1 on one side, and a second current collector 82 of the solar cell 1 on another side, among two adjacent solar cells 1.

The solar cell string 100 is a solar cell string of so-called singling structure. More specifically, in the solar cell string 100, each solar cell 1 is arranged so that the end on one side in the first direction overlaps a back side of an end on the other side in the first direction of the adjacent solar cell 1.

The wiring material 2 is not particularly limited; however, it is possible to form from a band-like body formed by braiding metal wire, band-like metallic foil, metal wire, or the like. The wiring material 2 can be joined to the first current collector 81 and second current collector 82 by the electrically-conductive paste forming the first current collector 81 and second current collector 82. As an example, in the case of the first current collector 81 and second current collector 82 being formed from solder, by heating in a state arranging the wiring material at the appropriate positions on the back surface side of the plurality of solar cells 1 arranged inline, it is possible to connect the wiring material 2 by reflowing the first current collector 81 and second current collector 82. The first current collector 81 and second current collector 82 may connect using the heat of a heating process upon sealing the solar cell string 100 in a solar cell module.

Although an embodiment of the present disclosure has been explained above, the present disclosure is not limited to the aforementioned embodiment, and various modifications and changes are possible. For example, the solar cell according to the present disclosure may not necessarily include a transparent electrode. In addition, the solar cell according to the present disclosure may further include, in addition the aforementioned constituent elements, constituent elements of an intrinsic semiconductor layer, passivation layer, anti-reflection film and protective film.

In the solar cell according to the present disclosure, the first connection electrode and second connection electrode can be omitted. For this reason, the solar call according to the present disclosure is not limited to one produced by the solar cell production method according to the present disclosure. As an example, the solar cell according to the present disclosure may be produced by forming the first base electrode and second base electrode by a subtractive method or additive method, followed by forming the first insulation and second insulation by lamination of the first insulating material.

The solar cells according to the present disclosure may be electrically connected in parallel, i.e. have the first current collectors and second current collectors of two or more solar cells connected by one or a plurality of wiring members.

In the solar cell production method according to the present disclosure, in the case that the second electrically-conductive paste forming the first current collector and second current collector can be reliably filled into an opening of the first electrode insulation formed in the first connection region and an opening of the second electrode insulation formed in the second connection region, the first electrically-conductive paste stacking step can be omitted. In other words, in the solar cell according to the present disclosure, the first connection electrode and second connection electrode can be omitted.

What is claimed is:

1. A solar cell comprising:
   a semiconductor substrate;
   a plurality of first semiconductor layers and a plurality of second semiconductor layers, each configured in a band shape extending in a first direction, and alternately provided in a second direction intersecting the first direction;
   a band-like first base electrode stacked on a back surface side of a central part in the second direction of each first semiconductor layer, and a band-like second base electrode stacked on a back surface side of a central part in the second direction of each second semiconductor layer;
   a first electrode insulation stacked on a back surface side of a first insulating area of each of the first base electrodes, wherein the first insulating areas are regions extending in the first direction in a same length as a corresponding band-like first base electrode, and wherein the first insulating areas are regions excluding first connection regions that are regions extending in the first direction having a smaller dimension than the first base electrodes in the second direction in a plan view, and
   a second electrode insulation stacked on a back surface side of a second insulating area of each of the second base electrodes, wherein the second insulating areas are regions extending in the first direction in a same length as a corresponding band-like second base electrode, and wherein the second insulating areas are regions excluding second connection regions that are regions extending in the first direction having a smaller dimension than the second base electrodes in the second direction in the plan view at a position shifted in the first direction from the first connection region;
   an intermediate insulation stacked on a back surface side of a region of the first semiconductor layer in which the first base electrode is not stacked, and on a back surface side of a region of the second semiconductor layer in which the second base electrode is not stacked; and
   a first current collector stacked to span the second electrode insulation and the intermediate insulation to connect between a plurality of the first connection regions, and a second current collector stacked to span the first electrode insulation and the intermediate insulation to connect between a plurality of the second connection regions.

2. The solar cell according to claim 1, wherein
   a material of the first current collector and the second current collector is solder or an electrically-conductive adhesive.

3. The solar cell according to claim 1, further comprising:
   a first connection electrode stacked on a back side surface of each first connection region of each first base electrode; and
   a second connection electrode stacked on a back surface side of each second connection region of each second base electrode.

4. The solar cell according to claim 1, further comprising:
   a first transparent electrode interposed between each first semiconductor layer and each first base electrode; and
   a second transparent electrode interposed between each second semiconductor layer and each second base electrode.

5. The solar cell according to claim 1, wherein
   the intermediate insulation is white in color.

6. The solar cell according to claim 2, further comprising:
   a first connection electrode stacked on a back side surface of each first connection region of each first base electrode; and
   a second connection electrode stacked on a back surface side of each second connection region of each second base electrode.

7. The solar cell according to claim 2, further comprising:
   a first transparent electrode interposed between each first semiconductor layer and each first base electrode; and
   a second transparent electrode interposed between each second semiconductor layer and each second base electrode.

8. The solar cell according to claim 3, further comprising:
   a first transparent electrode interposed between each first semiconductor layer and each first base electrode; and
   a second transparent electrode interposed between each second semiconductor layer and each second base electrode.

9. The solar cell according to claim 6, further comprising:
   a first transparent electrode interposed between each first semiconductor layer and each first base electrode; and
   a second transparent electrode interposed between each second semiconductor layer and each second base electrode.

10. The solar cell according to claim 2, wherein
    the intermediate insulation is white in color.

11. The solar cell according to claim 3, wherein
    the intermediate insulation is white in color.

12. The solar cell according to claim 4, wherein
    the intermediate insulation is white in color.

13. The solar cell according to claim 6, wherein
    the intermediate insulation is white in color.

14. The solar cell according to claim 7, wherein
    the intermediate insulation is white in color.

15. The solar cell according to claim 8, wherein
    the intermediate insulation is white in color.

16. The solar cell according to claim 9, wherein
    the intermediate insulation is white in color.

* * * * *